United States Patent [19]

Stribel

[11] Patent Number: 5,040,097
[45] Date of Patent: Aug. 13, 1991

[54] CENTRAL ELECTRIC UNIT FOR A MOTOR VEHICLE

[75] Inventor: Hans P. Stribel, Nürtingen, Fed. Rep. of Germany

[73] Assignee: Stribel GmbH, Nurtingen, Fed. Rep. of Germany

[21] Appl. No.: 31,163

[22] Filed: Mar. 25, 1987

Related U.S. Application Data

[63] Continuation of Ser. No. 792,828, Oct. 28, 1985, abandoned.

[30] Foreign Application Priority Data

Oct. 27, 1984 [DE] Fed. Rep. of Germany ....... 3439410

[51] Int. Cl.⁵ .......................................... H05K 1/14
[52] U.S. Cl. ..................................... 361/395; 439/76
[58] Field of Search ........................... 361/394–396, 361/399, 412; 439/65, 74, 76, 535; 307/9, 10 R, 10 LS

[56] References Cited

U.S. PATENT DOCUMENTS

| 3,500,130 | 3/1970 | Aument et al. | 361/394 |
| 3,870,839 | 3/1975 | Almich et al. | 339/17 LC |
| 4,135,226 | 1/1979 | Kourimsky | 361/415 |
| 4,218,724 | 8/1980 | Kaufman | 361/399 |
| 4,355,853 | 10/1982 | Kourimsky | 339/17 R |
| 4,444,452 | 4/1984 | Hilbrandt et al. | 339/176 M |
| 4,527,285 | 7/1985 | Kekas et al. | 361/394 |
| 4,557,225 | 10/1985 | Sagues et al. | 123/480 |
| 4,661,921 | 4/1987 | Barnes | 364/708 |
| 4,672,510 | 1/1987 | Castner | 361/399 |
| 4,695,753 | 8/1987 | Isshiki et al. | 439/78 |

FOREIGN PATENT DOCUMENTS

| 2641258 | 3/1978 | Fed. Rep. of Germany | 29/837 |
| 8034130 | 5/1981 | Fed. Rep. of Germany | . |
| 1590348 | 6/1981 | United Kingdom | . |

Primary Examiner—Neil Abrams
Attorney, Agent, or Firm—Michael J. Striker

[57] ABSTRACT

A central electric unit detachably interconnects various electric constructions parts and equipment such as wiring harnesses, connectors, fuses and switching devices for electric consuming circuits in a motor vehicle. The unit includes a housing structure provided with connecting plugs and sockets and enclosing a microcomputer which unifies controlling functions for all electric consumers. The microcomputer is separated from and operates independently of the exchangeable switching devices.

15 Claims, 2 Drawing Sheets

CENTRAL ELECTRIC UNIT FOR A MOTOR VEHICLE

This application is a continuation of application Ser. No. 792,828, filed Oct. 28, 1985, now abandoned.

BACKGROUND OF THE INVENTION

The present invention relates in general to an electric device for a motor vehicle and in particular to an unit for a central interconnection of electric components such as laced wiring harnesses, plug-in connectors, fuses, switching devices, electronic control devices for electric consumers in the car and the like.

Devices of this kind described for example in the German publication DE-GM 8034130, are generally called central electric units. They include a compact housing provided with solid conductive webs arranged at different levels.

Primarily, the function of the central electric unit is to distribute power or to branch electric current to different electric consuming circuits in a car, such as lamps, wipers, blinkers, heating, magnet valve and the like. There is also a possibility to use the central electric unit for monitoring the operational efficiency of respective consuming circuits and also for determining and signaling their malfunction. For this purpose, the electric consuming circuits are operated by switching devices which are mostly plugged into corresponding sockets in the upper side of the central electric unit. Cables or laced wiring harnesses, on the other hand, are usually attached by corresponding connectors to the lower side of the unit. In a known central electric unit, the plug in switching devices include frequently an electronic control circuit for operating the corresponding electric consuming circuits while the switching device itself is used in connection with a relay for turning on and off the consuming circuit.

The prior art arrangement of the central electric unit and the associated switching devices are expensive to manufacture. A separate electronic control circuit pertaining to a corresponding electric consuming circuit is associated with each switching device so that the manufacturing cost is further increased. Another disadvantage appears when the switching relay becomes damaged and the entire electronic control circuit must be discarded when the associated switching device is replaced. In addition in order to counteract voltage peaks, over voltage and negative pulses in the network of the motor vehicle, additional circuit adjustments and measures requiring further expensive component parts are necessary.

SUMMARY OF THE INVENTION

It is therefore a general object of the present invention to avoid the above mentioned disadvantages.

In particular it is an object of this invention to provide a compact and inexpensive central electric unit which combines a plurality of different controlling circuits for various electric consuming circuits of a motor vehicle, at a single location.

Another object of this invention is to provide such an improved circuit unit in which the controlling means or circuits for the consuming circuits are independent of respective switching devices.

Still another object of this invention is to increase substantially the range of controlling possibilities while the size of the central unit is reduced.

In keeping with these objects and others which will become apparent hereafter, one feature of the invention resides in a central electric unit of the above described kind, in the provision of a housing structure supporting at different levels a plurality of conductive webs, means for connecting to the webs electric devices including switching devices for the electric consuming circuits in the vehicle, a microcomputer arranged in the housing separately from the connecting means, the microcomputer including a circuit board connected to the conductive webs and supporting and interconnecting input/output means, a microprocessor, a memory for storing a control program, and at least one peripheral device connected between the input/output means and the microprocessor, the peripheral device including means for controlling operation of respective electric consuming circuits of the vehicle.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawing.

DESCRIPTION OF THE PREFERRED EMBODIMENTS

Figure 1:
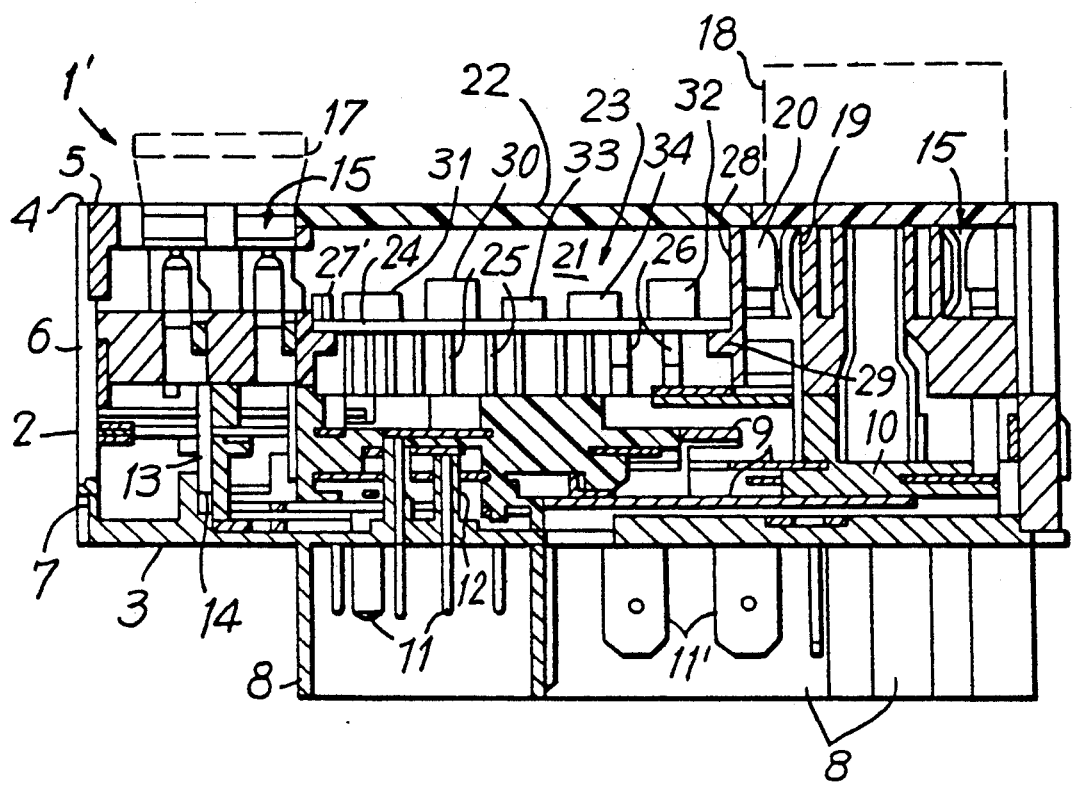
FIG. 1 is a sectional side view of a central electric unit of this invention.

FIG. 1 illustrates a central electric unit 1' designed for installation in a motor vehicle to interconnect by means of plug in socket connectors arranged at a central location various electric consuming circuit and control conduits. The unit 1' includes a two-part housing 2 made of a synthetic material. The upper housing part 4 has a top wall 5 and lateral walls 6 interchangeably connected by catches 7 to a lower housing part 3. In this manner housing 2 is completely closed.

The outer surface of lower housing part 3 is integral with several open compartments 8 extending downwardly and enclosing connectors 11 and 11' for the various consuming circuit and control conduits. The compartments are of different size and have an angular cross-section to prevent incorrect locking and/or displacement of the corresponding connector circuits. In addition, the walls of compartments 8 protect the connector against soiling.

Within the housing 2 there are supported at different levels electrically conductive webs 9 stamped out of metal sheets. The webs are insulated from one another by insulating plates 10 and are electrically connected to corresponding connector pins 11 and 11'. The pins which have a cylindrical or flat configuration, project through the lower housing part 3 in the connector compartments 8.

To improve electric insulation and to safeguard mutual spacing between connector pins 11 and between conductive webs 9, the connector pins are enclosed within insulating sleeves 12 projecting upwardly from the inner surface of the lower housing part 3. The passages in respective sleeves have circular or angular cross-section matching the cross-sections of corresponding pins 11.

End portions of conductive webs 9 are integrally connected with supporting webs 13 projecting at points 14 at right angles to the plane of conductive webs 9 toward the top wall 5 of the housing. The planar conductive webs 9 in the upper level of the housing are shaped and stamped in such a manner that the supporting webs 13 pass through corresponding openings or recesses. The insulation of spacings between the supporting webs 13 and the edges of the surrounding openings or recesses of the planar conductive webs 9 is provided by corresponding insulating layers of the intermediate insulation 10. In this manner an exact and stable stratification of the conductive webs 9 together with the transverse supporting webs 13 is guaranteed.

The upper ends of supporting webs 13 are integral with connector sockets 15 of the same material. The connector sockets are located approximately in one plane closely below the top wall 5 of housing 2. The inlets of the connector circuits are in alignment with corresponding slots 16 (FIG. 3) in the to wall 5. Connector pins of separate circuit breakers of fuses 17 or of separate switching devices 18 (indicated by dashed lines) are inserted through the slots 16 into the connector sockets 15.

Each connector socket 15 has a contact strip 19 facing at least one contact finger 20. A narrow run on side of the contact finger is directed at right angles to the broad surface of the contact strip 19.

The central electric unit 1' shown in FIG. 1 has a recess 21 located in the region between the lateral connector sockets 15 for the flat fuses 17 (left side) and for the switching devices 18 (right side), and above the intermediate conductive webs 9. The recess 21 is closed by a cover 22 which preferably is flush with the top wall 5. The cover 22 can be detachably mounted on the top wall or fixed to the latter by gluing, welding and the like to insure a sealing closure.

Figure 2:
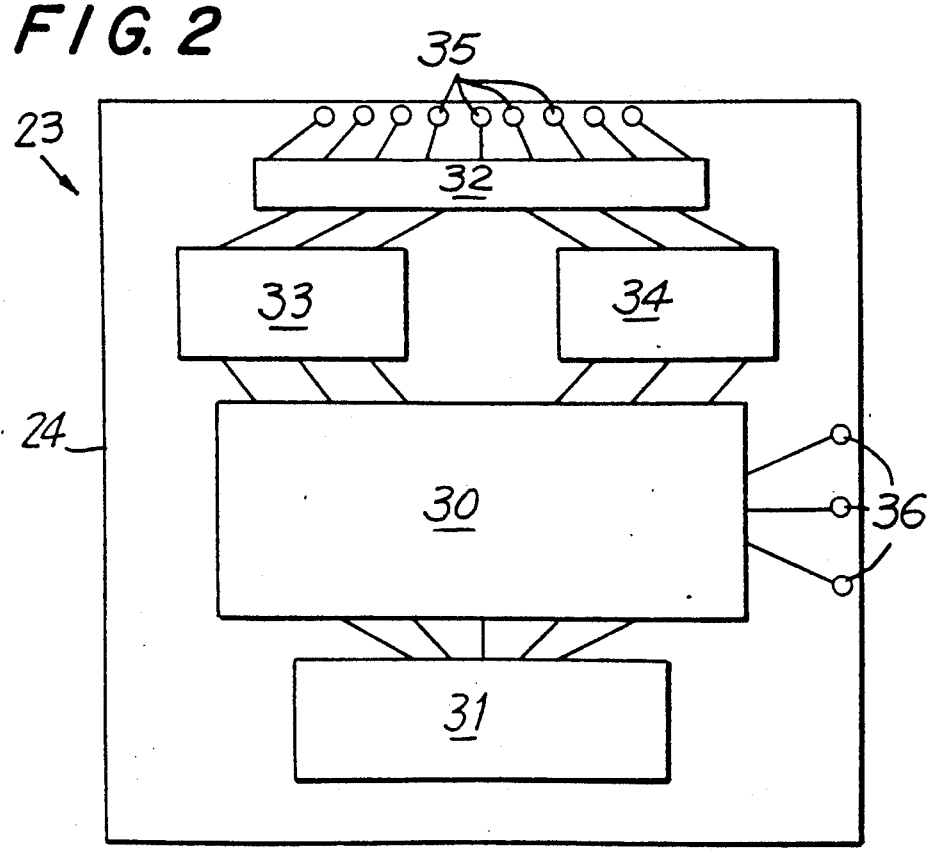
FIG. 2 shows on an enlarged scale a top view of a circuit board supporting a microcomputer for the device of FIG. 1.

The recess 21 receives a circuit board 24 with a microcomputer 23 whose layout is schematically illustrated in FIG. 2. The circuit board 24 has downwardly directed connection pins 25 and 26 which are permanently connected by soldering or welding, for example to appropriate underlying conductive webs 9. If desired, the connection pins 25 and 26 can be constructed as plug in pins engageable with corresponding conductive webs 9. It will be seen in FIG. 1, connection pins 26 pertaining to unit 32 are connected via corresponding conductive webs 9 and contact strip 19 with connector sockets 15 of switching devices 18. In addition an edge of the board 24 can also be provided with a contact board 27' engaging corresponding contacts 27 arranged on one of the lateral sides 28 of the recess 21 and being electrically connected to assigned conductive webs 9.

Preferably, rim portions of the circuit board 24 of the microcomputer rest on steps 29 on opposite inner side walls 8 of the recess and are secured to the steps by suitable snap catches or by screws.

The microcomputer is assembled of microprocessor 30, a program memory 31, an input/output unit 32 and also includes peripheral devices 32, 34 such as switching circuits and driving stages connected between the microprocessor and the input/output unit. The microcomputer is programmed to perform via peripheral devices 33, 34, input/output unit 32 and switching devices 18 all controlling functions needed for operation of various electric consuming circuits motor vehicle such as headlights, blinkers, wipers, window heating, window openers and the like. Consequently the individual prior art control circuits associated with the switching devices 18 can be eliminated and the devices 18 now contain only a relay or its functional equivalent for turning the consuming circuits on or off. The terminal contacts 35 of the input/output of the microcomputer are preferably arranged at an edge of the circuit board while another edge of the board supports contacts 36 for a power supply to the computer.

Figure 3:
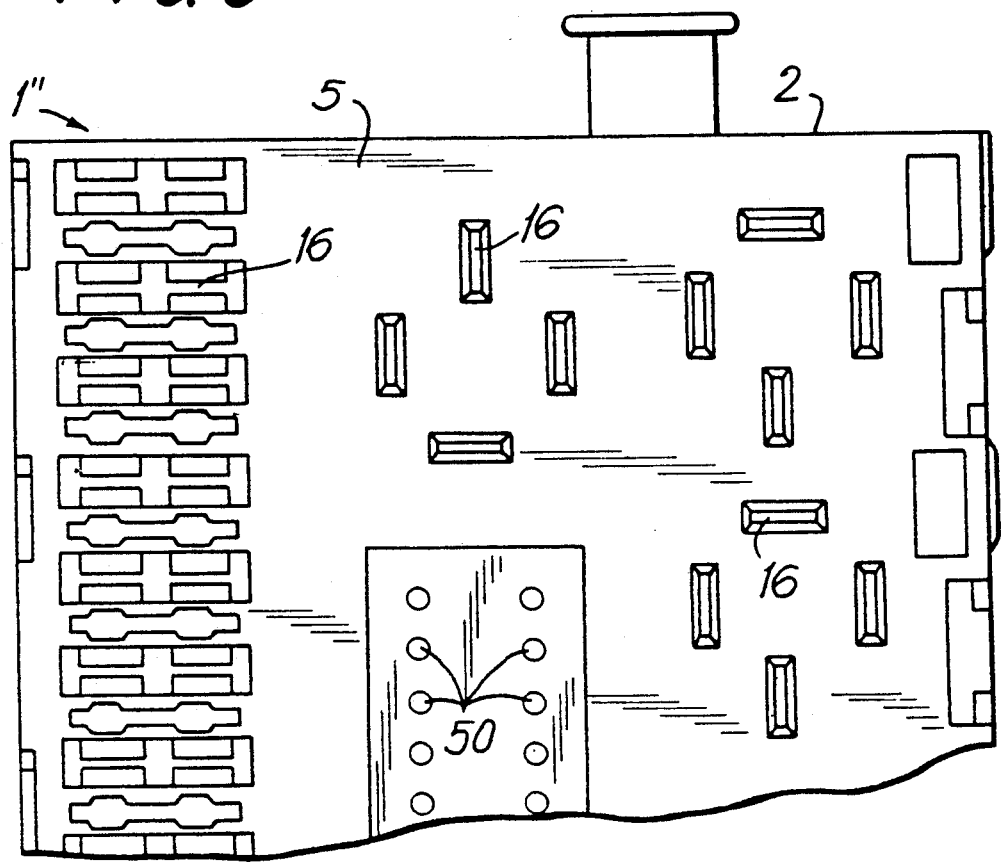
FIG. 3 is a top view of a cut away part of a modification of the unit of FIG. 1.
Figure 4:
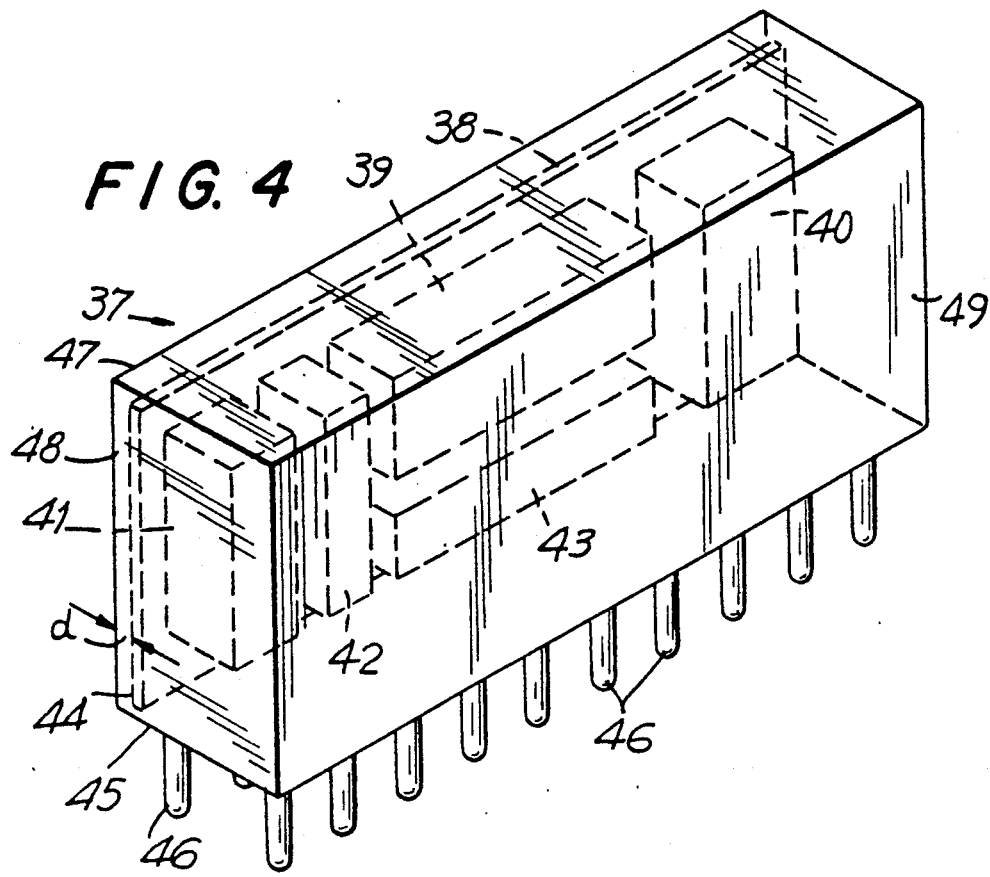
FIG. 4 is an isometric view of a plug in microcomputer module for the unit of FIG. 3.

In the embodiment of a central electric unit 1" of FIGS. 3 and 4, microcomputer 37 including a microprocessor 39, a program memory 40, an input/output unit 41 and peripheral devices 42, 43, is arranged on a circuit board 38 within a plug in microcomputer module 44. A base plate 45 of the module 44 is provided with two rows of connector pins 46 electrically connected with the printed circuit board 38.

The plug in module in this example has a substantially rectangular housing 47 attached to the base plate 45 either by snug lip connections or permanently by an adhesive or by welding. The base plate 45 and the housing 47 of the module 44 are with advantage made of an electrically insulating material. If desired, however, the housing can be produced of a metal sheet.

The connector pins 46 f the microcomputer module 44 can be inserted into connector sockets 50 on the top wall 5 of the housing 2 of the central electric unit 1" shown in FIG. 3. The underlying (non illustrated) contacts of the sockets 50 are arranged in two parallel rows between the slots 16 for fuses 17 and for switching devices 18. The circuit board 38 of the micro-computer 37 is mounted at right angles to the base plate 45 of the module. The plane of circuit board 38 is parallel with connector pins 46 and with longitudinal lateral walls 48 and 49. The bottom side of the circuit board is spaced a small distance d from the rear lateral wall 48.

The central electric unit of this invention has the advantage of a substantially increased operational reliability and in comparison with prior art units of this kind, employs a substantially reduced number of construction parts. The replacement of plug in switching devices is also less costly because the central controlling microcomputer 23 always remains in the unit. Another advantage of the arrangement of this invention is the fact that the integrated microcomputer circuit requires only a single protection device against voltage surges, excessive voltage levels and against negative pulses which may occur in the electric network of the motor vehicle. Moreover, there is a possibility to program practically without any additional cost, the microcomputer for performing additional controlling or regulating functions, for example monitoring proper operation of all electric circuits in the car and signaling deviations in operational conditions of the electric consuming circuits.

While the invention has been illustrated and described as embodied in specific examples of a central electric unit for motor vehicles, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims.

I claim:

1. A central electric device for use in motor vehicle to interconnect electrical parts of the vehicle inclusive of plug-in switching devices for electric consuming circuits, comprising a housing and, within the housing, a plurality of conductive webs arranged in mutually spaced relation at different levels; connectors mounted in said housing and being electrically connected to assigned conductive webs, said connectors including connector sockets for receiving said plug-in switching devices, and connector plugs connectable to the remaining electrical parts; a microcomputer arranged in said housing and including a circuit board supporting and interconnecting a microprocessor, a program memory, peripheral devices, and means for electrically connecting said peripheral devices with conductive webs assigned at least to the connector sockets for said switching device, said microcomputer being programmed for controlling via said peripheral devices operation of said switching devices to provide a central electronic control of said electric consuming circuits.

2. A device as defined in claim 1, wherein said microcomputer is arranged in a recess of said housing.

3. A device as defined in claim 2, wherein said recess for accommodating said microcomputer is closed by a cover which is flush with a wall of said housing.

4. A device as defined in claim 2, wherein opposite inner walls of said recess are provided with projections for supporting said circuit board of the microcomputer.

5. A device as defined in claim 4 wherein said circuit board is provided with downwardly directed connection pins permanently connected to the underlying conductive webs at the bottom of said recess.

6. A device as defined in claim 4, wherein said circuit board of the microcomputer is provided with connector pins insertable into corresponding connector sockets arranged at the bottom of said recess and electrically connected to assigned conductive webs.

7. A device as defined in claim 1 wherein said microcomputer is arranged in a plug in module have a base plate provided with plug connector pins and a module housing attached to said base plate, and a top wall of said housing being provided with connector sockets for receiving the connector pins of said module.

8. A device as defined in claim 7, wherein the module has a substantially rectangular configuration.

9. A device as defined in claim 8, wherein said module includes abase plate provided with two parallel rows of connector pins electrically connected to said microcomputer, said circuit board of the microcomputer extending at right angles to said base plate and parallel to a lateral wall of said module and the bottom side of said circuit board being spaced apart a small distance from the inner side of said lateral wall.

10. A device as defined in claim 1, wherein a bottom wall of said housing is provided with at least one open compartment enclosing at least a part of said connecting means to receive a connector plug leading to said electric consumer circuits.

11. A device as defined in claim 4 wherein said connectors include contacts arranged on at least one edge of said circuit board of the microcomputer to engage countercontacts provided at a side wall of said recess and leading to assigned conductive webs.

12. A device as defined in claim 1, said switching devices having connector pins plugged into the assigned connector sockets; and said circuit board being arranged in said housing at a location spaced apart from the connector sockets for said switching devices.

13. A device as defined in claim 1, further comprising means arranged in said housing for protecting the microcomputer against voltage surges, overloads and polarity reversals.

14. A device as defined in claim 12, wherein said housing as a lower base provided with connector pins connected to assigned conductive webs, and said microcomputer being arranged in one plane above said conductive webs.

15. A device as defined in claim 12 wherein said electric consuming circuits include exchangeable fuses provided with connector pins, said connector including connector sleeves for receiving the pins of said fuses and the pins of said switching devices, and the microcomputer being arranged between the connector sleeves for said fuses and switching devices.

* * * * *